(12) United States Patent
Obermaier et al.

(10) Patent No.: US 12,740,424 B2
(45) Date of Patent: Sep. 15, 2026

(54) ELECTRONIC DEVICES INCLUDING DEVICE PACKAGES HAVING A PORT HOLE WITH A SPARK ARREST SHOULDER AND RELATED METHODS

(71) Applicant: RF360 Singapore Pte. Ltd., Singapore (SG)

(72) Inventors: Christian Obermaier, Munich (DE); Matthias Eberhardt Jungkunz, Munich (DE)

(73) Assignee: RF360 SINGAPORE PTE. LTD., Singapore (SG)

( * ) Notice: Subject to any disclaimer, the term of this patent is extended or adjusted under 35 U.S.C. 154(b) by 412 days.

(21) Appl. No.: 18/585,382

(22) Filed: Feb. 23, 2024

(65) Prior Publication Data

US 2025/0273603 A1 Aug. 28, 2025

(51) Int. Cl.

| | |
|---|---|
| ***H10W 42/60*** | (2026.01) |
| ***B81B 7/00*** | (2006.01) |
| ***H10W 70/05*** | (2026.01) |
| ***H10W 70/685*** | (2026.01) |

(52) U.S. Cl.
CPC ........... *H10W 42/60* (2026.01); *B81B 7/0061* (2013.01); *B81B 7/0064* (2013.01); *H10W 70/05* (2026.01); *H10W 70/685* (2026.01)

(58) Field of Classification Search
CPC ..... H10W 42/60; H10W 42/80; H10W 70/05; H10W 70/685; H10W 70/60; B81B 7/0061; B81B 7/0064; B81B 2201/0257
See application file for complete search history.

(56) References Cited

U.S. PATENT DOCUMENTS

| | | | | |
|---|---|---|---|---|
| 2010/0273286 A1* | 10/2010 | Liang | B81C 1/00246 | 257/E21.211 |
| 2012/0153771 A1* | 6/2012 | Formosa | H04R 19/005 | 310/300 |

* cited by examiner

*Primary Examiner* — Dale E Page
*Assistant Examiner* — Quovaunda Jefferson
(74) *Attorney, Agent, or Firm* — Withrow & Terranova, PLLC

(57) ABSTRACT

An electronic device may include a device that communicates with the environment of the user, which may include acoustic, radio, optical, etc., information. The device is mounted on a first side of a multi-layer substrate in a device package. To provide communicative access to the environment, the device is mounted on a first opening of a port hole that extends through the multi-layer substrate. The port hole includes a second opening in a first substrate layer on a second side of the multi-layer substrate, where the second opening is wider than a third opening in a second substrate layer, to form a shoulder region that is exposed through the second opening and on which a conductive layer coupled to a reference voltage can provide a spark arrestor to protect the device from damage due to electric sparks entering from the environment.

20 Claims, 9 Drawing Sheets

ELECTRONIC DEVICES INCLUDING DEVICE PACKAGES HAVING A PORT HOLE WITH A SPARK ARREST SHOULDER AND RELATED METHODS

BACKGROUND

I. Field of the Disclosure

The technology of the disclosure relates generally to reducing spark-related damage to electronic devices and, more particularly, to spark arrestors in user devices.

II. Background

Electronic devices may include one or more internal devices for communicating with the environment, such as microphones, speakers, pressure sensors, and optical sensors. To access the environment, the electronic device may include a port hole providing a path between the internal device and the environment. When these devices are frequently handled by users, they may develop electrostatic charge differences between the user and/or nearby objects. When such charge differences exceed a threshold, a discharge may occur in either direction in the form of a spark. The internal devices of an electronic device have an electrical potential that can make them an attractive destination for such discharges, especially because such internal devices are exposed to the environment through the port holes needed for their operation. Consequently, such devices are highly susceptible to damage from sparks. A burst of charge from a spark can damage electrical components, and a sudden expansion of gas caused by localized heating from the spark can also damage mechanical components.

SUMMARY

Aspects disclosed in the detailed description include electronic devices including device packages having a port hole with a spark arrest shoulder. Related methods of forming a device package, including a spark arrest shoulder, are also disclosed. The electronic device may include a device that receives information communicated in signals from the environment of the user outside of the device, which may include acoustic signals, radio signals, or optical signals, for example. The device is mounted on a first side of a multi-layer substrate as part of a device package. To provide communicative access to the environment, the device is mounted on a first opening of a port hole that extends through the multi-layer substrate from a second side, opposite to the first side, so that a signal from the environment may pass through the port hole to reach the device. In an exemplary aspect, the package includes a spark arrestor disposed inside the port hole and coupled to a reference voltage. The spark arrestor is provided to attract sparks to protect the device from damage due to electric sparks entering from the environment. In some examples, the port hole includes a second opening in a first substrate layer on the second side of the multi-layer substrate. In such examples, the second opening may be wider than a third opening in a second substrate layer, forming a shoulder region inside the port hole that is exposed through the second opening. The spark arrestor may include a conductive layer on the shoulder region.

In this regard, in one exemplary aspect, a package is disclosed. The package includes a multi-layer substrate, a port hole through the multi-layer substrate and including a first opening on a first side of the multi-layer substrate and a second opening on a second side of the multi-layer substrate, opposite to the first side. The package further includes a device disposed on the first opening of the port hole and having a first voltage and a spark arrestor, including a first conductive layer of the multi-layer substrate disposed inside the port hole and coupled to a reference voltage.

In another exemplary aspect, an electronic device, including a device package, is disclosed. The device package includes a multi-layer substrate, a port hole through the multi-layer substrate and including a first opening on a first side of the multi-layer substrate and a second opening on a second side of the multi-layer substrate, opposite to the first side. The device package further includes a device disposed on the first opening of the port hole and having a first voltage, an integrated circuit coupled to the device, and a spark arrestor including a first conductive layer of the multi-layer substrate disposed inside the port hole and coupled to a reference voltage.

In another exemplary aspect, a method of forming a package is disclosed. The method includes forming a multi-layer substrate and forming a port hole through the multi-layer substrate and including a first opening on a first side of the multi-layer substrate and a second opening on a second side of the multi-layer substrate opposite to the first side. The method further includes disposing a device having a first voltage on a first opening of the port hole and forming a spark arrestor inside the port hole, including a first conductive layer of the multi-layer substrate coupled to a reference voltage.

DETAILED DESCRIPTION

Figure 1A:
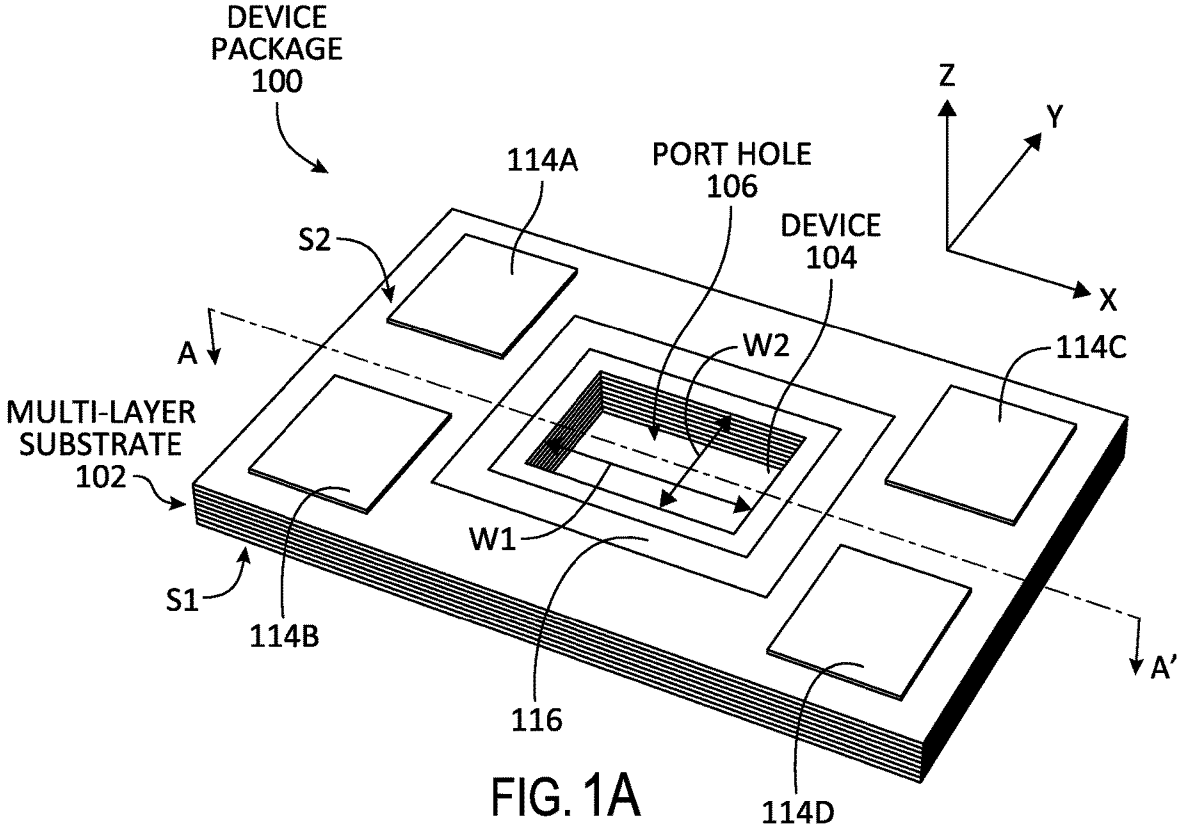
FIG. 1A is a perspective view from one side of a conventional device package including a multi-layer substrate that may be employed in an electronic device, such as a smartphone, and includes a port hole through the multi-layer substrate through which a device disposed on the port hole on the other side of the multi-layer substrate can communicate with the environment.

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Aspects disclosed in the detailed description include electronic devices including device packages having a port hole with a spark arrest shoulder. Related methods of forming a device package, including a spark arrest shoulder, are also disclosed. The electronic device may include a device that receives information communicated in signals from the environment of the user outside of the device, which may include acoustic signals, radio signals, or optical signals, for example. The device is mounted on a first side of a multi-layer substrate as part of a device package. To provide communicative access to the environment, the device is mounted on a first opening of a port hole that extends through the multi-layer substrate from a second side, opposite to the first side, so that a signal from the environment may pass through the port hole to reach the device. In an exemplary aspect, the package includes a spark arrestor disposed inside the port hole and coupled to a reference voltage. The spark arrestor is provided to attract sparks to protect the device from damage due to electric sparks entering from the environment. In some examples, the port hole includes a second opening in a first substrate layer on the second side of the multi-layer substrate. In such examples, the second opening may be wider than a third opening in a second substrate layer, forming a shoulder region inside the port hole that is exposed through the second opening. The spark arrestor may include a conductive layer on the shoulder region.

FIG. 1A is a perspective view of a conventional device package 100 that may be employed in an electronic device (not shown), such as a smartphone. The device package 100 includes a multi-layer substrate 102 and a device 104 disposed on a first side S1 of the multi-layer substrate 102. The following description of the device package 100 also refers to features shown more clearly in FIG. 1B. The multi-layer substrate 102 includes a port hole 106 with the device 104 disposed on the port hole 106 on the first side S1 of the multi-layer substrate 102 to allow the device 104 to communicate through the port hole 106 with the environment on a second side S2 of the multi-layer substrate 102. The device 104 may include an electrical circuit 108 coupled to a power source, such as a battery (not shown), to receive a supply voltage $V_{DD}$ and a reference voltage $V_{SS}$. The device 104 may also be a mechanical or electromechanical device having a voltage $V_{104}$ independent of the supply voltage $V_{DD}$ and a reference voltage $V_{SS}$.

Some examples of the device 104 may include micro-electromechanical (MEMS) devices configured to detect acoustic variations (e.g., a microphone) or air pressure. Other examples of the device 104 may include an audio speaker or an optical or wireless transmitter or receiver. Other examples may include integrated circuits (ICs). Receiving or transmitting any of acoustic signals, air pressure, optical signals, infrared, ultraviolet, wireless etc., are examples of the device 104 communicating with the environment on the second side S2 through the port hole 106. The device 104 may have one surface 110 configured for the communication, and the surface 110 is disposed on the first side S1 of the multi-layer substrate 102 on (e.g., over) an opening 112(J) in the port hole 106. The port hole 106 may improve communication between the surface 110 and the environment.

The multi-layer substrate 102 in FIG. 1A includes electrical contacts 114A-114D, which may provide the supply voltage $V_{DD}$ and the reference voltage $V_{SS}$ from an external circuit. The electrical contacts 114A-114D may also provide control and/or data signals to or from the electrical circuit 108 in the device 104. The electrical contacts 114A-114D are merely representative as there may be any number of contacts provided as needed for functions of the device package 100. In the example in FIG. 1A, the device 104 is an acoustic sensor. Thus, the device package 100 also includes a seal 116 provided on the surface of the second side S2 between the multi-layer substrate 102 and a package substrate (not shown) to provide an acoustic seal around the port hole 106.

Figure 1B:
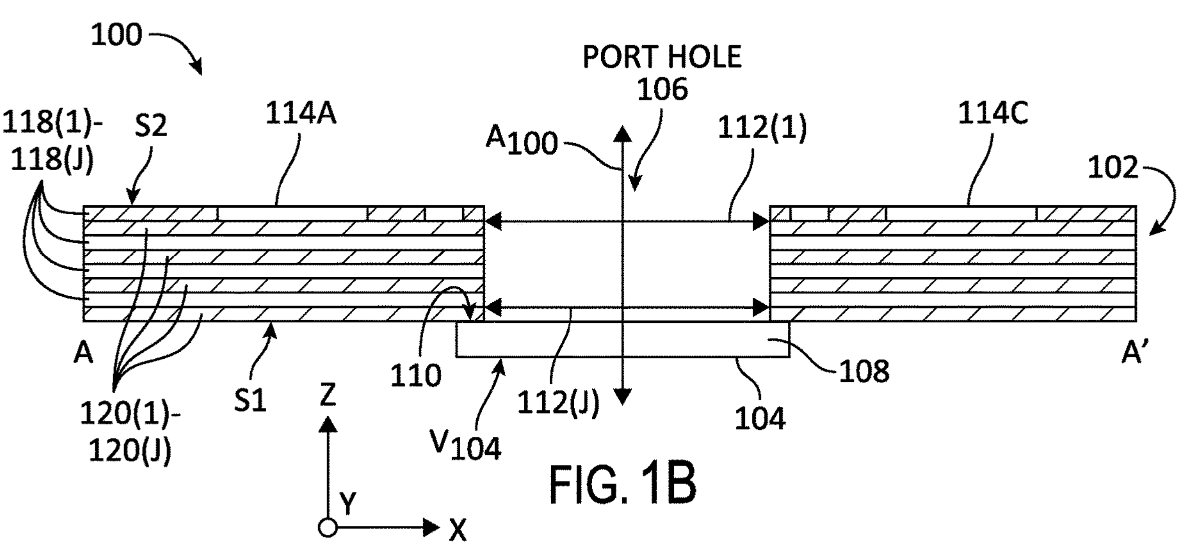
FIG. 1B is a cross-sectional side view of the multi-layer substrate illustrated in FIG. 1A with the device disposed over the port hole on one side to show that a size of the opening of the port hole remains constant through the multi-layer substrate.

FIG. 1B is a cross-sectional side view of the multi-layer substrate 102 in FIG. 1A. In FIG. 1B, it can be seen that the multi-layer substrate 102 includes multiple conductive layers 118(1)-118(J) alternating with dielectric layers 120(1)-120(J). The conductive layers 118(1)-118(J) are formed of one or more conductive materials (e.g., metals), and the dielectric layers 120(1)-120(J) may include or consist of dielectric and/or insulating materials (e.g., pre-preg). There may be any number J of the conductive layers 118(1)-118(J) and a corresponding number J of the dielectric layers 120(1)-120(J). The conductive layers 118(1)-118(J) may be patterned to form circuits that are interconnected by vias (not shown) through the dielectric layers 120(1)-120(J).

The port hole 106 is formed by the openings 112(1)-112(J), respectively, through the conductive layers 118(1)-118(J) and the dielectric layers 120(1)-120(J). In the example in FIGS. 1A and 1B, it can be seen that each of the openings 112(1)-112(J) have a same first width W1 in a first direction (X-axis direction) and a same second width W2 in a second direction (Y-axis direction). An axis $A_{100}$ of the port hole 106 extends orthogonally to the multi-layer substrate 102 through all of the openings 112(1)-112(J).

A problem encountered with the conventional device package 100 in FIGS. 1A and 1B is that sparks, such as from electrostatic discharge from a hand of a user, an external object, or the environment, may enter the port hole 106 and reach the electrical circuit 108 in the device 104, causing damage to the device 104 that may render it inoperable. An electrostatic discharge may be attracted to the supply voltage $V_{DD}$, the reference voltage $V_{SS}$ (not shown) coupled to the device 104, or the independent voltage $V_{104}$ of the device.

Figure 1C:
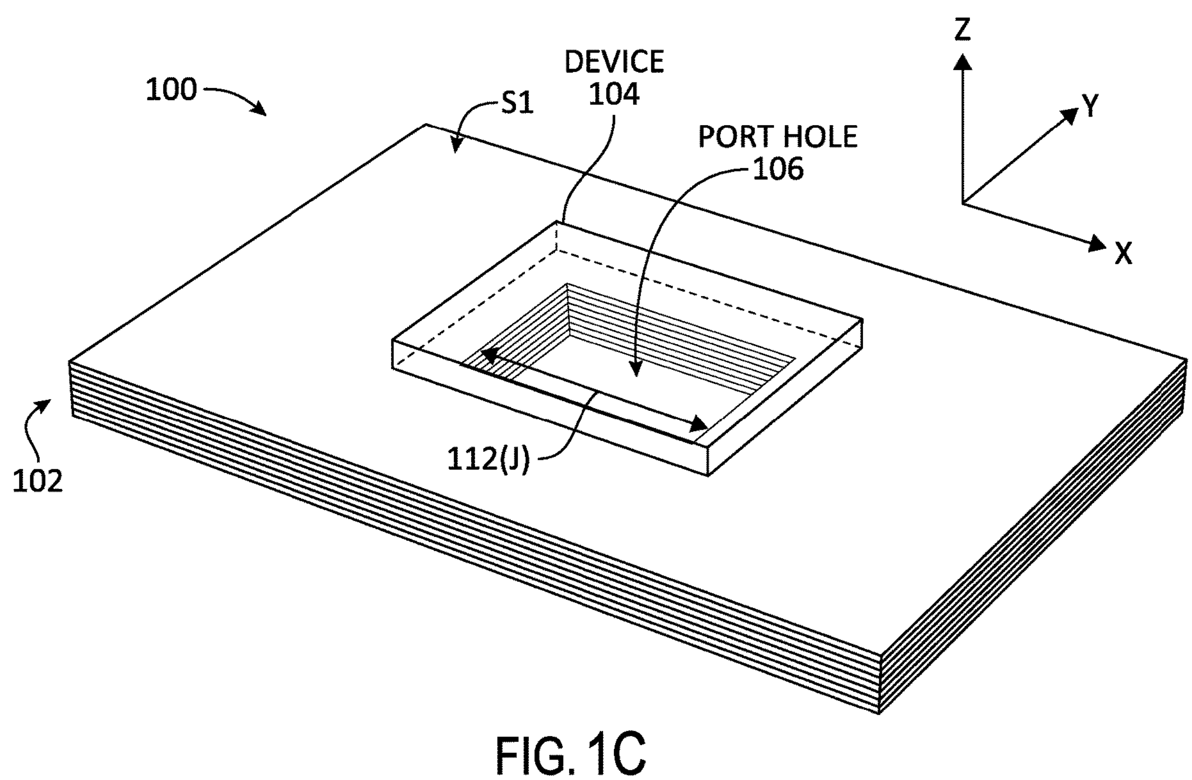
FIG. 1C is a perspective view of the device disposed on the port hole on one side of the multi-layer substrate in FIG. 1A for communicative access to the environment on the other side.

FIG. 1C is a perspective view showing the device 104 disposed on the port hole 106 on the first side S1 of the multi-layer substrate 102 in the device package 100 in FIGS. 1A and 1B. The device 104 is disposed over the opening 112(J) of the port hole 106 on the first side S1. Although not shown here, the first side S1 may include other devices, such as integrated circuits and/or other electrical or electronic components that may be damaged by sudden bursts of electrical charge (i.e., sparks). One or more of these other devices may be electrically connected with the device 104 such that a spark striking the device 104 may be propagated to an electrically connected device, which can result in the other device(s) as well as the device 104.

Figure 2A:
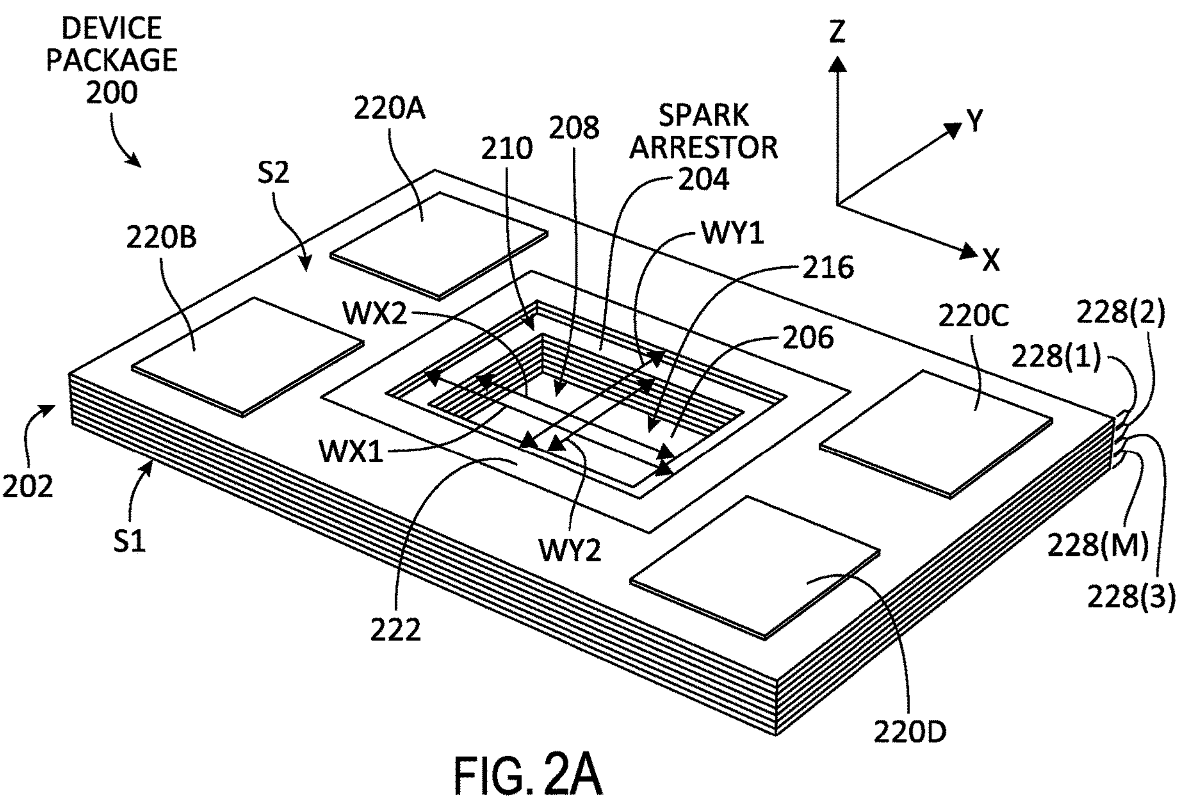
FIG. 2A is a perspective view of one side of an exemplary device package, including a multi-layer substrate that may be employed in an electronic device, such as a smartphone, and includes a port hole including a spark arrest shoulder to protect a device disposed on the port hole on the other side of the multi-layer substrate from sparks attracted to the device from the environment.

FIG. 2A is a perspective view of one side of an exemplary device package 200, including a multi-layer substrate 202 including a spark arrestor 204 that may be employed in an electronic device (not shown), such as a smartphone. The device package 200 includes a device 206 disposed on a port hole 208 on the first, back side S1 of the multi-layer substrate 202. The multi-layer substrate 202 includes a shoulder region 210 on which the spark arrestor 204 is provided to protect the device 206 from sparks attracted to or directed to the device 206 from outside the device package 200.

In some aspects, the device package 200 includes features that correspond to the features of the device package 100 of FIGS. 1A-1C. In the following description, reference may also be made to features shown more clearly in FIG. 2B. For example, the device 206 may include an electrical circuit 212 coupled to a power source, such as a battery (not shown) to receive a supply voltage $V_{DD}$ and/or a package reference voltage $V_{SS}$. Examples of the device 206 include micro-electromechanical (MEMS) devices configured to detect acoustic variations (e.g., a microphone) or air pressure, audio speakers or optical or wireless transmitters or receivers. Other examples of the device 206 may include mechanical devices, electromechanical devices, and electrical devices, such as integrated circuits (ICs). In this regard, the device 206 may have a first voltage $V_{206}$ that is different from the supply voltage $V_{DD}$ and the reference voltage $V_{SS}$ of the package 200. The device 206 may have a first surface 216 configured for communication, and the device 206 is disposed on the first side S1 of the multi-layer substrate 202 on (e.g., over) the first surface 216 facing a first opening 218(M) (where M=4 in this example) in the port hole 208. The electrical circuit 212 may be coupled to other devices and/or components on the first side S1 of the multi-layer substrate 202 by wires or by contacts between the first surface 216 and the first side S1. The multi-layer substrate 202 in FIG. 2A also includes electrical contacts 220A-220D on the second side S2, which are representative of any number of contacts used to provide connections for signals and power between the device package 200 and an external circuit.

Figure 2B:
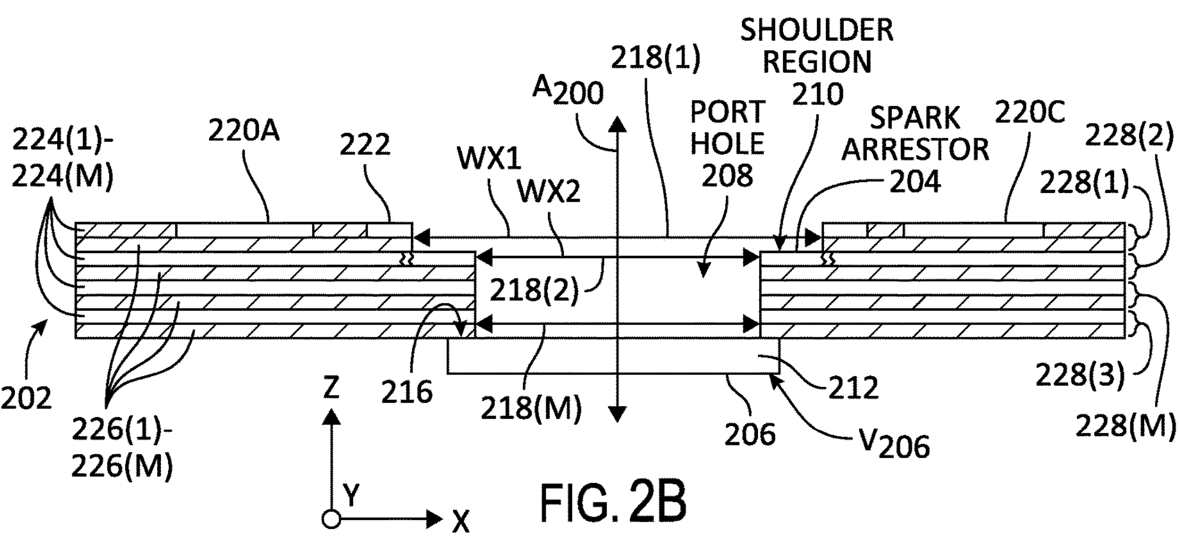
FIG. 2B is a cross-sectional side view of the multi-layer substrate illustrated in FIG. 2A, showing the device disposed over the port hole on one side and showing a first opening size of the port hole in a first substrate layer and a smaller opening size in another layer to provide a shoulder on which a spark arrestor is formed.

In the example in FIGS. 2A and 2B, the device 206 may be an acoustic sensor, such as a MEMS device. Thus, the device package 200 in this example includes an acoustic seal 222 provided on a first conductive layer 224(1) on the second side S2 of the multi-layer substrate 202 between the multi-layer substrate 202 and a package substrate (not shown) to provide an acoustic seal 222 around the port hole 208. The acoustic seal 222 may also or alternatively be employed as an electrical contact. Thus, the acoustic seal 222 may be formed of a conductive material, such as metal, or a non-conductive material. In other examples of the device 206, the device package 200 may not include the acoustic seal 222.

FIG. 2B is a cross-sectional side view of the multi-layer substrate 202. The multi-layer substrate 202 comprises alternating conductive layers 224(1)-224(M) and dielectric layers 226(1)-226(M). In some examples, there may be an additional conductive layer (224(M+1) (not shown) in the multi-layer substrate 202. A single one of the conductive layers 224(1)-224(M) paired with an adjacent one of the dielectric layers 226(1)-226(M) is referred to herein as one of a plurality of substrate layers 228(1)-228(M) of the multi-layer substrate 202. The first substrate layer 228(1) includes the first conductive layer 224(1) and the first dielectric layer 226(1). The multi-layer substrate 202 comprises the first substrate layer 228(1) on the second side S2 and a second substrate layer 228(2) between the first substrate layer 228(1) and the first side S1 of the multi-layer substrate 202. The conductive layers 224(1)-224(M) be patterned to form circuits that are interconnected by vias (not shown) through the dielectric layers 226(1)-226(M).

The port hole 208 in the multi-layer substrate 202 is formed by openings 218(1)-218(M) through the substrate layers 228(1)-228(M). It should be understood that each of the openings 218(1)-218(M) extends through one of the conductive layers 224(1)-224(M) and an adjacent one of the dielectric layers 226(1)-226(M). In the exemplary device package 200, a second opening 218(1) of the port hole 208 through the first substrate layer 228(1) is wider in a first direction (e.g., X-axis direction) than a third opening 218(2) of the port hole 208 through the second substrate layer 228(2). That is, the second opening 218(1) has a width WX1 in the first direction and the third opening 218(2) has a width WX2 in the first direction, and WX2 is smaller than WX1. In addition, the second opening 218(1) has a larger width WY1 in a second direction (Y-axis direction) than a width WY2 in the second direction of the third opening 218(2) through the second substrate layer 228(2). The second direction is orthogonal to the first direction. An axis $A_{200}$ of the port hole 208 extends in a third direction (Z-axis direction) that is orthogonal to both the first direction (X-axis) and the second direction (Y-axis). The axis $A_{200}$ of the port hole 208 is also an axis of all the openings 218(1)-218(M).

With the widths WX2 and WY2 of the second substrate layer 228(2) being smaller than the corresponding widths WX1 and WY1 of the first substrate layer 228(1), the shoulder region 210 is a portion of the second substrate layer 228(2) exposed through the second opening 218(1) of the first substrate layer 228(1) on the second side S2 of the multi-layer substrate 202 in the third (Z-axis) direction. In the shoulder region 210, the second substrate layer 228(2) comprises a conductive layer 224(2) configured to be coupled to the reference voltage $V_{SS}$. The conductive layer 224(2) provides the spark arrestor 204. In some examples, the conductive layer 224(2) may include sections electrically isolated from each other and each coupled to different voltage potentials, such that the shoulder region 210 may be coupled to the reference voltage $V_{SS}$ or another voltage potential and other sections may be coupled to another voltage potential, which may include the supply voltage $V_{DD}$. In some examples, the shoulder region 210 may be formed on the third substrate layer 228(3), for example, where a fourth opening 218(3) is smaller (e.g., in at least one of the first and second directions) than the second opening 218(1) and the third opening 218(2).

The conductive layer 224(2) disposed in the shoulder region 210 may be a layer of conductive material (e.g., copper) disposed continuously around the entire perimeter of the third opening 218(2). In other examples, the conductive layer 224(2) may be patterned (not shown) such that portions of the conductive layer 224(2) are disposed on separate areas around the shoulder region 210, such as around the perimeter of the third opening 218(2). Each of such portions is configured to couple to the reference voltage $V_{SS}$, for example (not shown).

As noted, the conductive layer 224(2) configured to couple to the reference voltage $V_{SS}$ and disposed on the exposed shoulder region 210 of the second substrate layer 228(2) provides the spark arrestor 204. That is, a spark arriving from any side or axially into the second opening 218(1) is likely to pass close to the conductive layer 224(2) because it is exposed on the shoulder region 210. Such sparks may be electrically attracted to the voltage potential of the conductive layer 224(2), so the conductive layer 224(2) provides an attractive path to the reference voltage $V_{SS}$ (e.g., ground). In this way, the forward progress of the electrical charge or spark is safely arrested before it reaches the first surface 216 of the device 206 disposed on the first opening 218(M) on the first side S1 of the multi-layer substrate 202.

Figure 3:
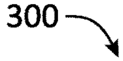
FIG. 3 is a flowchart of a method of forming a device package comprising a port hole in a multi-layer substrate, including a spark arrestor shoulder to protect the device disposed over the port hole.
Figure 3:
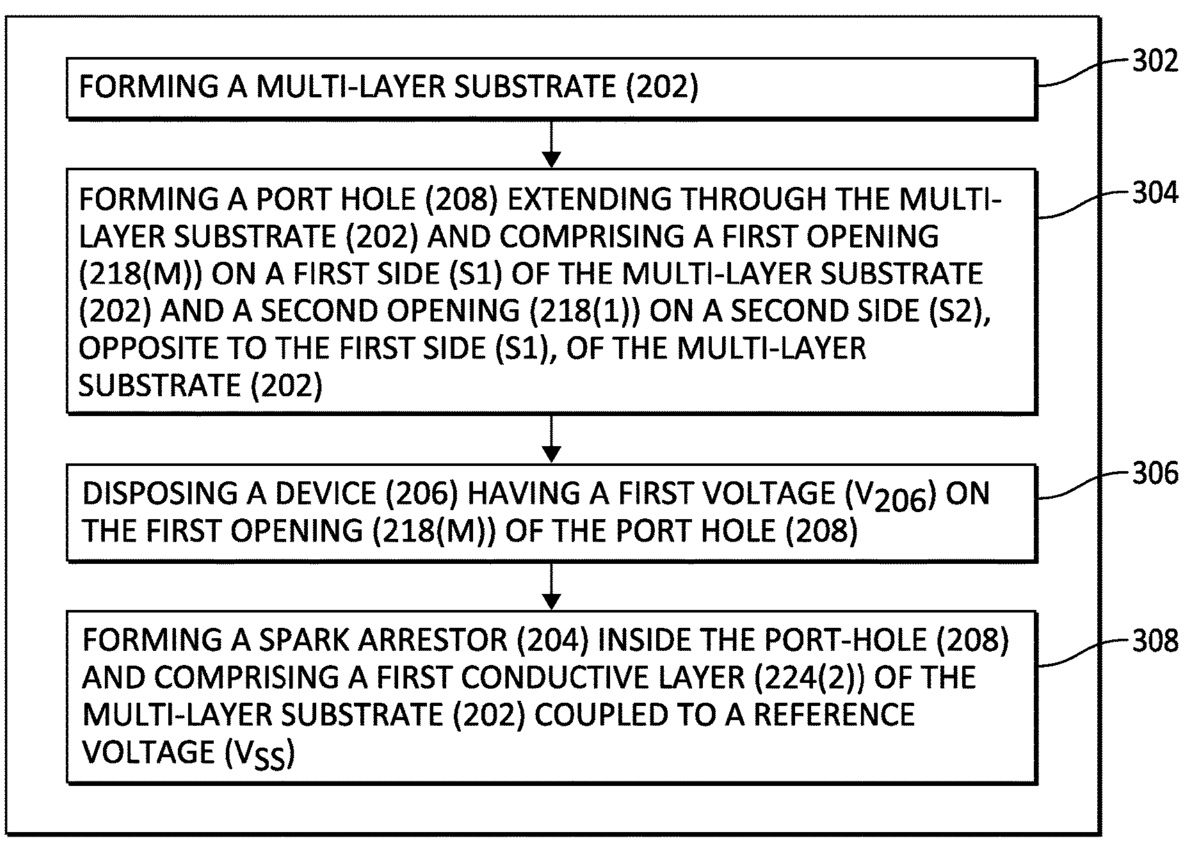

FIG. 3 is a flow chart of a method 300 of forming the device package 200. The method comprises forming a multi-layer substrate 202 (block 302); forming a port hole 208 through the multi-layer substrate 202 and comprising a first opening 218(M) on a first side S1 of the multi-layer substrate 202 and a second opening 218(1) on a second side S2 opposite to the first side S1, of the multi-layer substrate 202 (block 304); and disposing a device 206 having a first voltage $V_{206}$ on the first opening 218(M) (block 306). The method also includes forming a spark arrestor 204 inside the port hole 208 and comprising a first conductive layer 224(2) of the multi-layer substrate 202 coupled to a reference voltage $V_{SS}$ (block 308).

Figure 4:
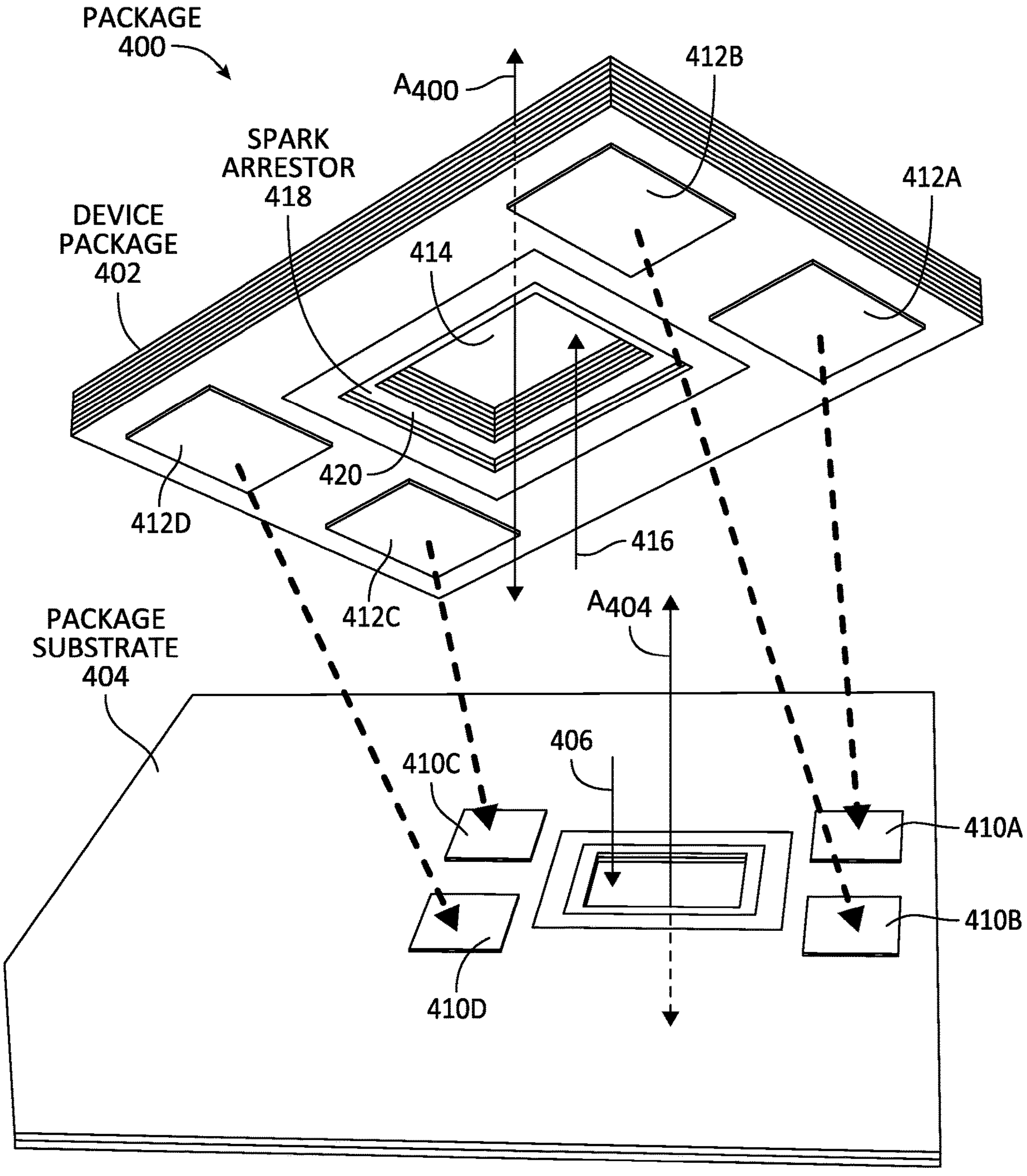
FIG. 4 is an illustration of an example of a package substrate including contacts for coupling to the multi-layer substrate in FIGS. 2A-2B and a port hole axially aligned with the port hole in the multi-layer substrate to provide the device access to the environment through the package.

FIG. 4 is a perspective view of elements of a package 400 detached from each other to more clearly show respective contacts for electrically coupling the elements, which include a device package 402 and a package substrate 404. The device package 402 may be the device package 200 in FIGS. 2A and 2B and will not be described in further detail here. The package substrate 404 includes a port hole 406. The package substrate 404 includes contacts 410A-410D configured to align with contacts 412A-412D of the device package 402. The contacts 410A-410D are merely representative of a number of contacts that may be provided between the device package 402 and the package substrate 404 to convey electrical power or signals between the device package 402 and an external circuit (not shown).

The package substrate 404 and the device package 402 are oriented such that an axis $A_{404}$ of the port hole 406 in the package substrate 404 is aligned (e.g., collinear) with an axis $A_{400}$ of the device package 402. In this manner, a device 414 disposed on a port hole 416 in the device package 402 continues to have communicative access to the environment after the device package 402 is coupled to the package substrate 404. The device package 402 is provided with a spark arrestor 418 on a shoulder region 420 to attract sparks entering the package 400 through the port hole 406 in the package substrate 404 to protect the device 414.

Figure 5:
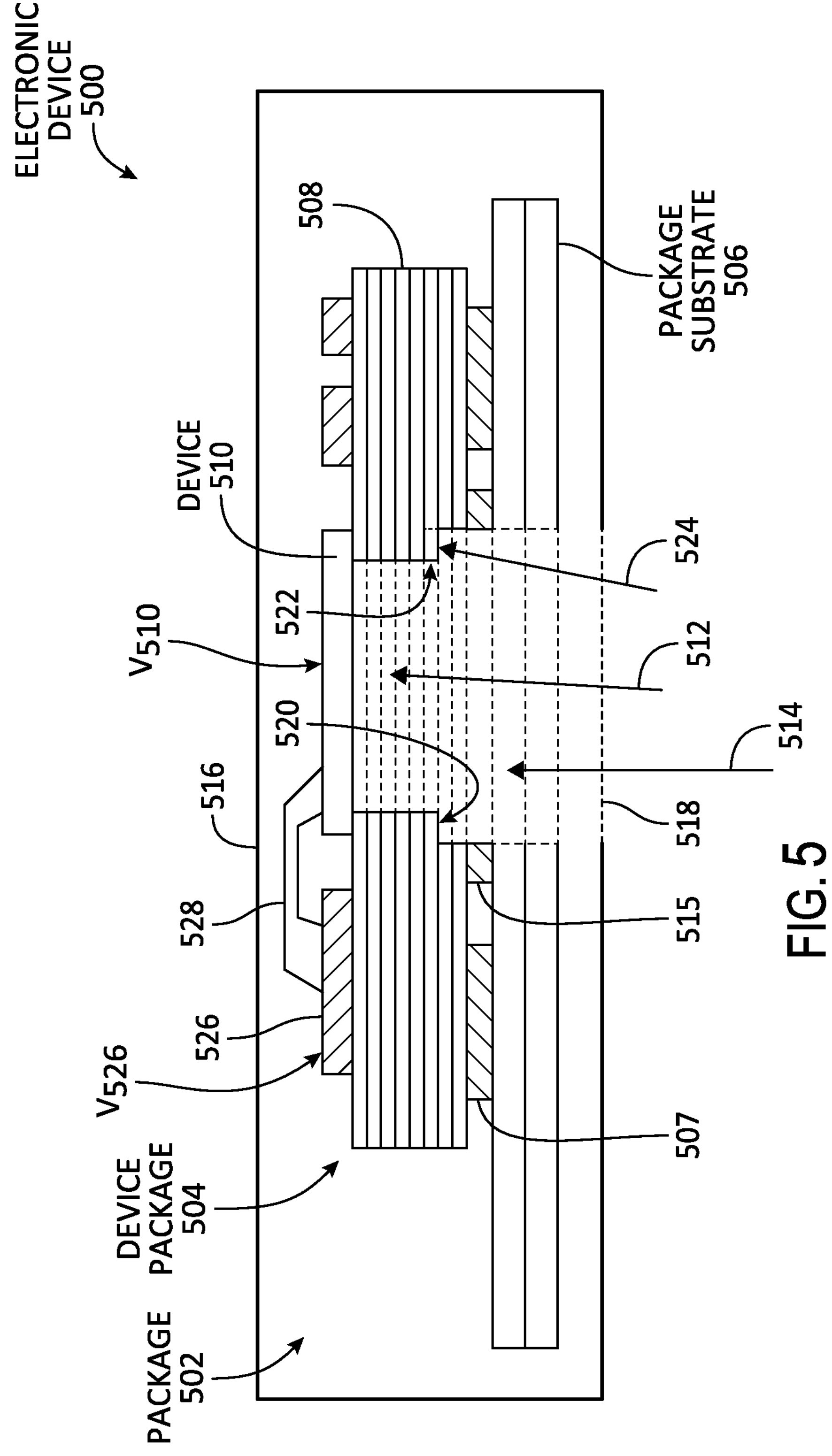
FIG. 5 is an illustration of a side view of an electronic device including a device package including the package substrate and multi-layer substrate in FIG. 4 and a device disposed on the port hole on the multi-layer substrate to communicate with the environment outside the electronic device.

FIG. 5 is an illustration of a side view of an electronic device 500, including a package 502, which may be the package 400 in FIG. 4. The package 502 includes a device package 504 coupled to a package substrate 506, corresponding to the device package 402 and the package substrate 404 in FIG. 4, through contacts 507. The device package 504 includes a multi-layer substrate 508, which may be the multi-layer substrate 202 in FIGS. 2A and 2B and includes a device 510 disposed on a port hole 512 through the multi-layer substrate 508. The package substrate 506 also includes a port hole 514 aligned with the port hole 512. A seal 515 is disposed around the port hole 512 between the device package 504 and the package substrate 506. The package 502 is disposed in a housing 516 that includes a port 518 aligned with the port holes 512 and 514 to provide communicative access to the environment for the device 510. The port 518 may be an opening, a screen, a perforated surface, a membrane, a window or lens, etc., depending on the device 510. In some examples, the port 518 provides a direct line-of-sight for the device 510 to communicate with the environment outside the electronic device 500.

Figure 6A:
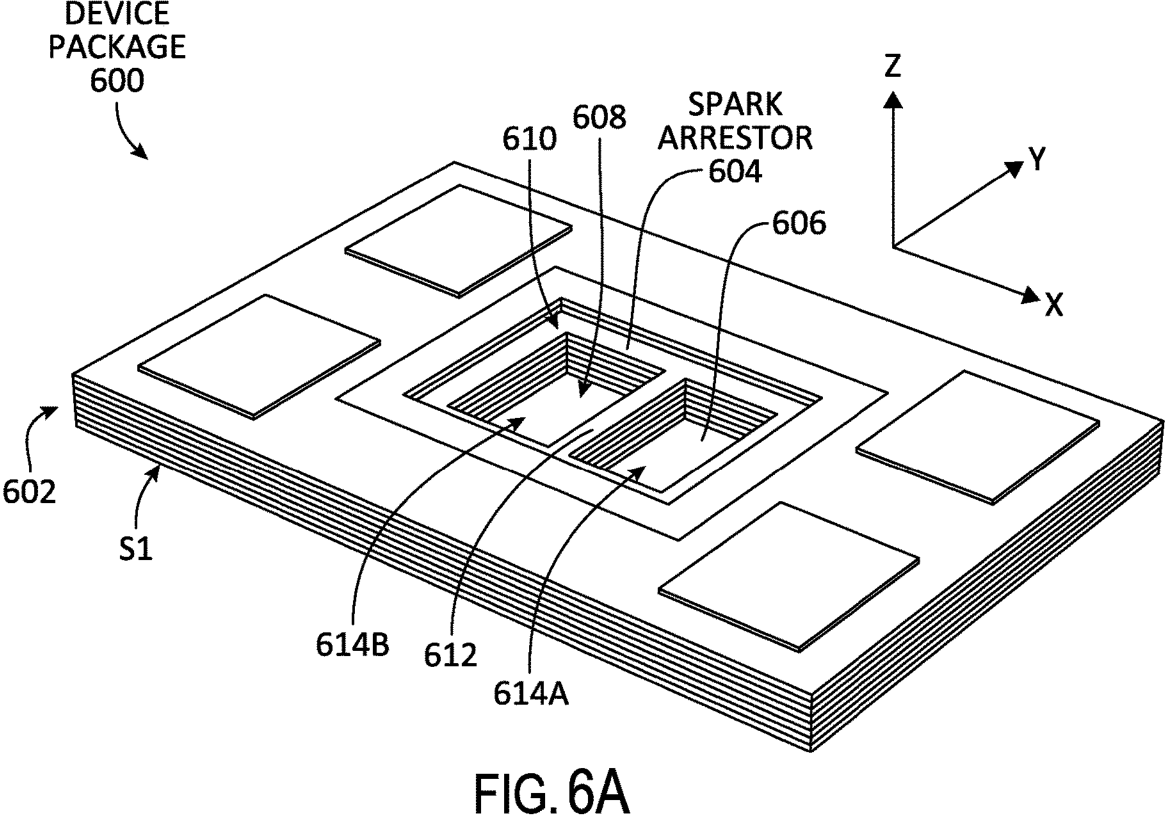
FIGS. 6A and 6B are a perspective view and a cross-sectional side view, respectively, of a second example of an exemplary device package, including a multi-layer substrate that may be employed in an electronic device, such as a smartphone, and including a port hole divided into two sections, with the spark arrestor also employed on the divider to improve the ability to attract sparks entering the port hole.
Figure 6B:
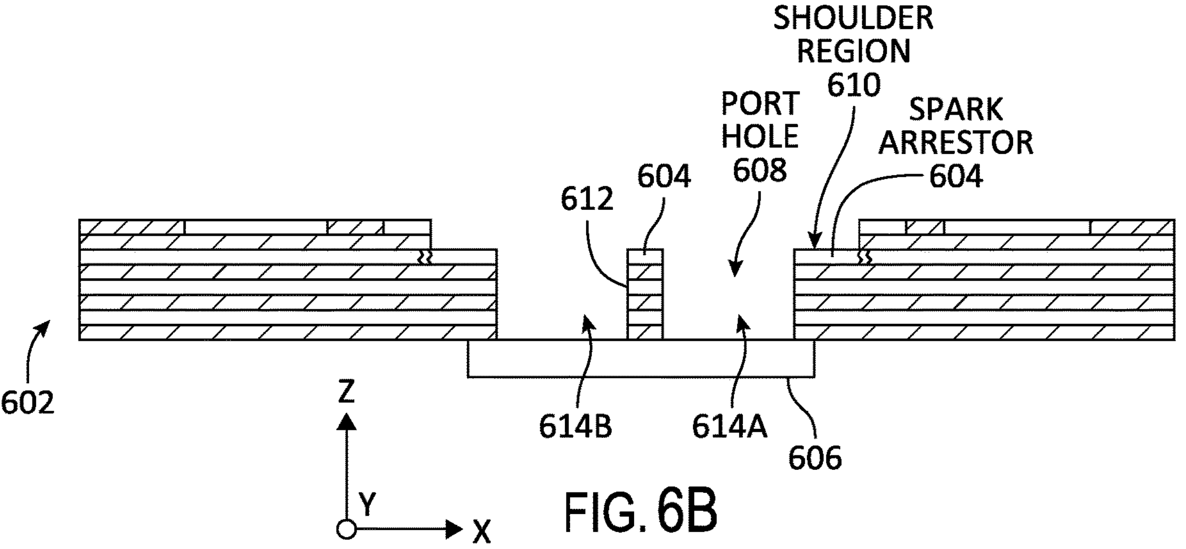

The multi-layer substrate 508 includes a shoulder region 520 including a conductive layer 522 providing a spark arrestor 524, as discussed above, to protect the device 510 from sparks (e.g., electrostatic charges) that may enter the device 500 through the port 518. The device 510 may be in electrical contact with other devices or components 526 through wires 528 or wire traces (not shown) on the first side S1 of the multi-layer substrate 508. The device 510 may include electrical circuits or provide electrical signals having a voltage $V_{510}$ while the component 526 includes circuits at a different voltage $V_{526}$, and the spark arrestor 524 may receive the package reference voltage $V_{SS}$. Such devices or components 526 would also be protected from damage due to sparks by the spark arrestor 524. FIGS. 6A and 6B are a perspective view and a cross-sectional view of another example of a multi-layer substrate 602 including a spark arrestor 604 in an electronic device (not shown), such as a smartphone. A device package 600 corresponds in many aspects to the device package 200 in FIGS. 2A and 2B. The device package includes a device 606 disposed on a port hole 608 on the first, back side S1 of the multi-layer substrate 602. The multi-layer substrate 602 includes a shoulder region 610 on which the spark arrestor 604 is provided to protect the device 606 from sparks that may be attracted or directed to the device 606 from outside the device package 600.

In this example, the port hole 608 includes a divider 612 extending between two sections 614A and 614B of the port hole 608. To improve the capability of the spark arrestor 604 to protect the device 606, the spark arrestor 604 disposed on the shoulder region 610 extends onto the divider 612. In this regard, spark protection is provided across a middle region of the port hole 608 rather than on the perimeter alone.

Electronic devices, according to any aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 7:
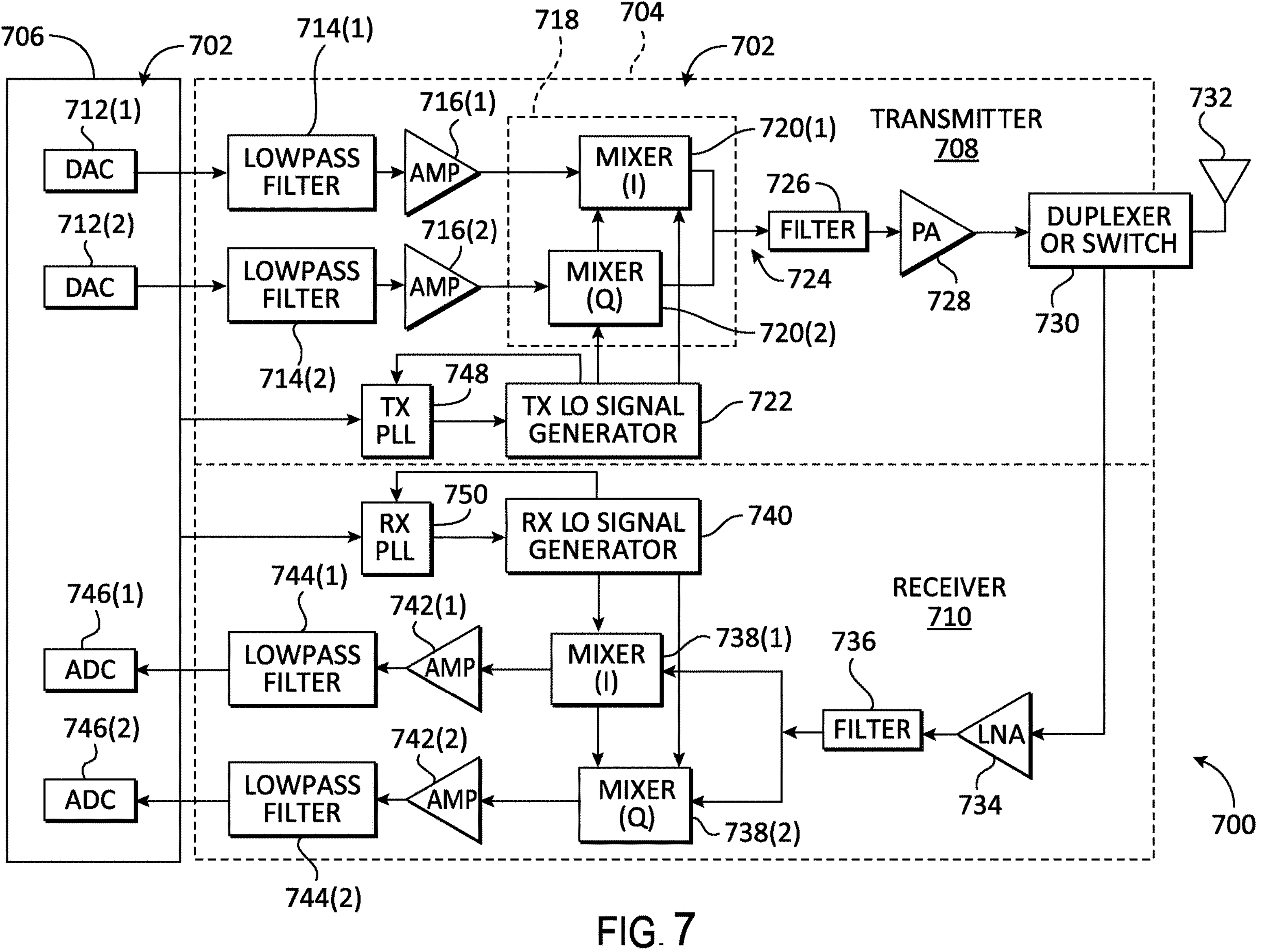
FIG. 7 is a block diagram of an exemplary wireless communication device that includes an exemplary device package including a multi-layer substrate with a port hole for environmental access and a spark arrestor shoulder to protect a device disposed on the port hole from an electric spark, as shown in FIGS. 2A, 2B, and 4.

In this regard, FIG. 7 illustrates a block diagram of an exemplary wireless communications device 700 that includes radio frequency (RF) components formed from one or more ICs 702, wherein the communications device 700 may be the electronic device 500 in FIG. 5 including the device package 504 and/or package 502, which correspond to the device package 200 and package 400 illustrated in FIGS. 2A, 2B, and 4, including a device disposed on a port hole in a multi-layer substrate for communicative access to the environment and a shoulder region comprising a spark arrestor formed on a second substrate layer having a smaller opening than a first substrate layer to protect the device from damage caused by sparks. The wireless communications device 700 may include or be provided as examples in any of the above-referenced devices. As shown in FIG. 7, the wireless communications device 700 includes a transceiver 704 and a data processor 706. The data processor 706 may include a memory to store data and program codes. The transceiver 704 includes a transmitter 708 and a receiver 710, which support bi-directional communications. In general, the wireless communications device 700 may include any number of transmitters 708 and/or receivers 710 for any number of communication systems and frequency bands. All or a portion of the transceiver 704 may be implemented on one or more analog ICs, RF ICs (RFICs), mixed-signal ICs, etc.

The transmitter 708 or the receiver 710 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog converters (DACs) 712(1), 712(2) for converting digital signals generated by the data processor 706 into I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMPs) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals from a TX LO signal generator 722 through mixers 720(1), 720(2) to provide an upconverted signal 724. A filter 726 filters the upconverted signal 724 to remove undesired signals caused by the frequency upconversion and noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by AMPs 742(1), 742(2) and further filtered by lowpass filters 744(1), 744(2) to obtain I and Q analog input signals, which are provided to the data processor 706. In this example, the data processor 706 includes analog-to-digital converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked loop (PLL) circuit 748 receives timing information from the data processor 706 and generates a control signal used to adjust the frequency and/or phase of the TX LO signals from the TX LO signal generator 722. Similarly, an RX PLL circuit 750 receives timing information from the data processor 706 and generates a control signal used to adjust the frequency and/or phase of the RX LO signals from the RX LO signal generator 740.

Figure 8:
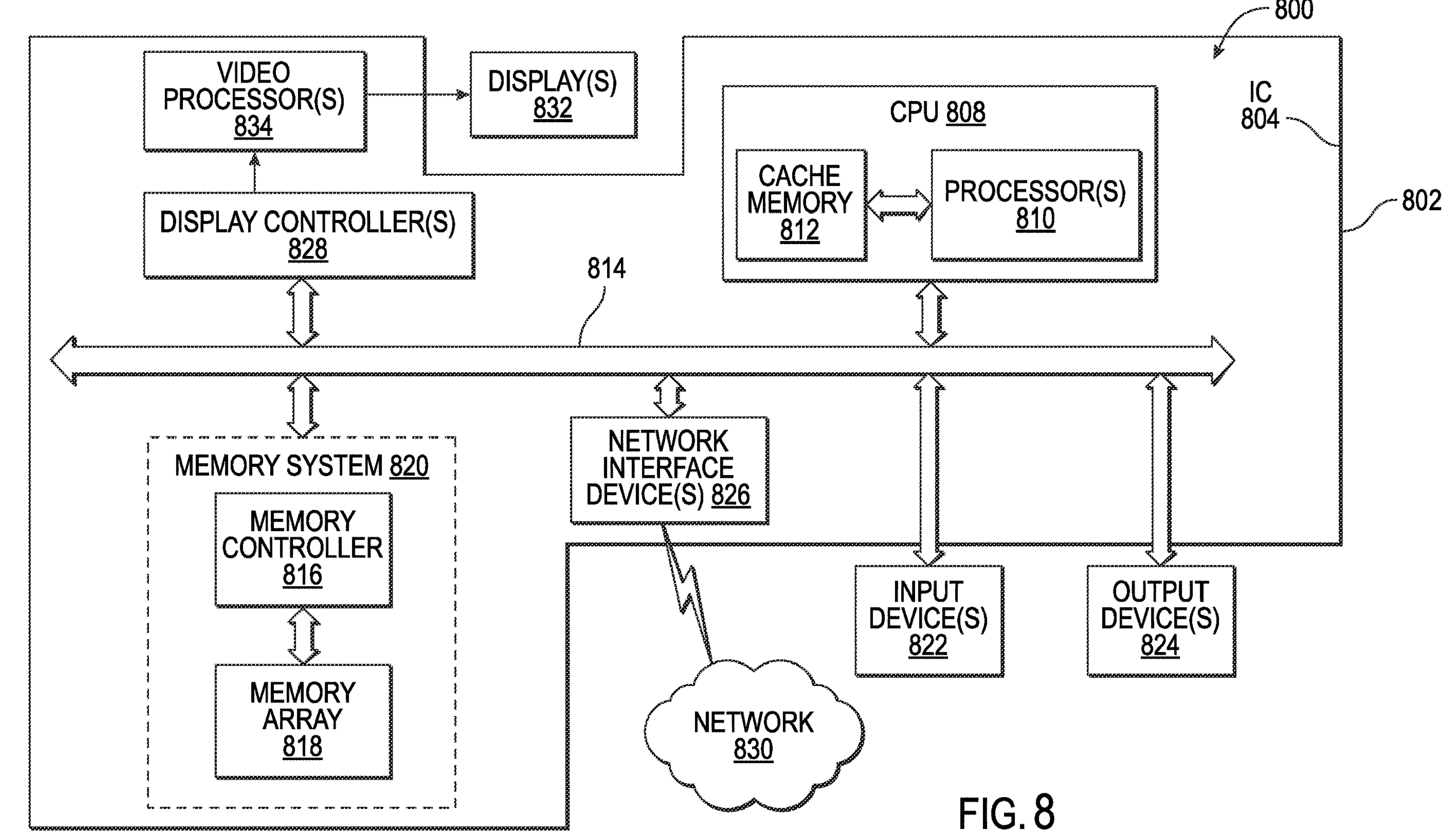
FIG. 8 is a block diagram of an exemplary processor-based system in an electronic device that may be included on an exemplary device package, including a multi-layer substrate with a port hole for environmental access and a spark arrest shoulder to protect a device disposed on the port hole from electric spark, as shown in FIGS. 2A, 2B, and 4.

FIG. 8 illustrates a block diagram of an example of a processor-based system 800 that may be implemented in the electronic device 500 in FIG. 5 including the device package 504 and/or package 502, which correspond to the device package 200 and package 400 illustrated in FIGS. 2A, 2B, and 4, including a device disposed on a port hole in a multi-layer substrate for communicative access to the environment and a shoulder region comprising a spark arrestor formed on a second substrate layer having a smaller opening than a first substrate layer to protect the device from damage caused by sparks. In this example, the processor-based system 800 includes a processor 802 that includes an IC 804 including one or more central processor units (CPUs) 808, which may also be referred to as CPU or processor cores, each including one or more processors 810. The CPU(s) 808 may have cache memory 812 coupled to the processor(s) 802 for rapid access to temporarily stored data. The CPU(s) 808 is coupled to a system bus 814 and can intercouple master and slave devices included in the processor-based system 800. As is well known, the CPU(s) 808 communicates with these other devices by exchanging address, control, and data information over the system bus 814. For example, the CPU(s) 808 can communicate bus transaction requests to a memory controller 816 as an example of a slave device. Although not illustrated in FIG. 8, multiple system buses 814 could be provided wherein each system bus 814 constitutes a different fabric.

Other master and slave devices can be connected to the system bus 814. As illustrated in FIG. 8, these devices can include a memory system 820 that includes the memory controller 816 and one or more memory arrays 818, one or more input devices 822, one or more output devices 824, one or more network interface devices 826, and one or more display controllers 828, as examples. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow an exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The CPU(s) 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display(s) 832 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A package comprising:
   - a multi-layer substrate;
   - a port hole through the multi-layer substrate comprising a first opening on a first side of the multi-layer substrate and a second opening on a second side of the multi-layer substrate, opposite to the first side; and
   - a device disposed on the first opening of the port hole and having a first voltage; and
   - a spark arrestor comprising a first conductive layer of the multi-layer substrate disposed inside the port hole and coupled to a reference voltage.
2. The package of clause 1, wherein:
   - the multi-layer substrate comprises:
     - a first substrate layer on the second side of the multi-layer substrate; and a second substrate layer between the first substrate layer and the first side of the multi-layer substrate;

the second opening of the port hole through the first substrate layer is wider in a first direction than a third opening of the port hole through the second substrate layer;

a shoulder region of the second substrate layer is exposed through the second opening from the second side of the multi-layer substrate; and the first conductive layer is disposed in the shoulder region of the second substrate layer.

3. The package of clause 2, wherein:

the second substrate layer further comprises a first dielectric layer between the first conductive layer and the first side of the multi-layer substrate; and the first substrate layer further comprises a second conductive layer and a second dielectric layer between the second conductive layer and the second substrate layer.

4. The package of clause 3, the multi-layer substrate comprising at least a third substrate layer comprising a third conductive layer and a third dielectric layer between the second substrate layer and the first side of the multi-layer substrate.

5. The package of clause 2, wherein:

the second opening of the port hole is wider in a second direction than the third opening of the port hole; and the second direction is orthogonal to the first direction.

6. The package of clause 5, wherein an axis of the port hole is orthogonal to the first direction and the second direction.

7. The package of clause 2, wherein each of the second opening and the third opening of the port hole comprises one of a round opening and a polygonal opening.

8. The package of clause 2, further comprising:

a package substrate coupled to the second side of the multi-layer substrate; and a hole through the package substrate;

wherein a longitudinal axis of the hole through the package substrate extends along a longitudinal axis of the hole through the multi-layer substrate.

9. The package of clause 8, further comprising:

an acoustic seal disposed around the second opening between the first substrate layer and the package substrate;

wherein the device comprises an acoustic device.

10. The package of clause 9, wherein the acoustic seal comprises a metal layer coupled to the reference voltage.

11. The package of clause 1, wherein the device comprises an electromechanical device.

12. The package of clause 1, wherein the device comprises an environmental sensor.

13. The package of clause 2, wherein the shoulder region extends around an entire perimeter of the third opening.

14. The package of clause 2, wherein the first conductive layer extends continuously around an entire perimeter of the third opening.

15. The package of clause 2, wherein the first conductive layer comprises a plurality of portions disposed around the shoulder region and each of the plurality of portions is coupled to the reference voltage.

16. The package of clause 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

17. An electronic device comprising:

a device package comprising:

a multi-layer substrate;

a port hole through the multi-layer substrate and comprising a first opening on a first side of the multi-layer substrate and a second opening on a second side of the multi-layer substrate, opposite to the first side;

a device disposed on the first opening of the port hole and having a first voltage;

an integrated circuit coupled to the device; and a spark arrestor comprising a first conductive layer of the multi-layer substrate disposed inside the port hole and coupled to a reference voltage.

18. The electronic device of clause 17, wherein:

the multi-layer substrate comprises:

a first substrate layer on the second side of the multi-layer substrate; and a second substrate layer between the first substrate layer and the first side of the multi-layer substrate;

a second opening of the port hole through the first substrate layer is wider in a first direction than a third opening of the port hole through the second substrate layer;

a shoulder region of the second substrate layer is exposed through the second opening from the second side of the multi-layer substrate; and the second substrate layer comprises a first conductive layer in the shoulder region coupled to the reference voltage.

19. The electronic device of clause 18, further comprising:

a package substrate coupled to the second side of the multi-layer substrate; and a hole through the package substrate;

wherein a longitudinal axis of the hole through the package substrate extends along a longitudinal axis of the hole through the multi-layer substrate.

20. A method of forming a package comprising:

forming a multi-layer substrate;

forming a port hole through the multi-layer substrate and comprising a first opening on a first side of the multi-layer substrate and a second opening on a second side of the multi-layer substrate, opposite to the first side;

disposing a device having a first voltage on the first opening of the port hole; and forming a spark arrestor inside the port hole comprising a first conductive layer of the multi-layer substrate coupled to a reference voltage.

What is claimed is:

1. A package comprising:

a multi-layer substrate;

a port hole through the multi-layer substrate and comprising a first opening on a first side of the multi-layer substrate and a second opening on a second side of the multi-layer substrate, opposite to the first side; and a device disposed on the first opening of the port hole and having a first voltage; and a spark arrestor comprising a first conductive layer of the multi-layer substrate disposed inside the port hole and coupled to a reference voltage.

2. The package of claim 1, wherein:

the multi-layer substrate comprises:

a first substrate layer on the second side of the multi-layer substrate; and a second substrate layer between the first substrate layer and the first side of the multi-layer substrate;

the second opening of the port hole through the first substrate layer is wider in a first direction than a third opening of the port hole through the second substrate layer;

a shoulder region of the second substrate layer is exposed through the second opening from the second side of the multi-layer substrate; and the first conductive layer is disposed in the shoulder region of the second substrate layer.

3. The package of claim 2, wherein:

the second substrate layer further comprises a first dielectric layer between the first conductive layer and the first side of the multi-layer substrate; and the first substrate layer further comprises a second conductive layer and a second dielectric layer between the second conductive layer and the second substrate layer.

4. The package of claim 3, the multi-layer substrate comprising at least a third substrate layer comprising a third conductive layer and a third dielectric layer between the second substrate layer and the first side of the multi-layer substrate.

5. The package of claim 2, wherein:

the second opening of the port hole is wider in a second direction than the third opening of the port hole; and the second direction is orthogonal to the first direction.

6. The package of claim 5, wherein an axis of the port hole is orthogonal to the first direction and the second direction.

7. The package of claim 2, wherein each of the second opening and the third opening of the port hole comprises one of a round opening and a polygonal opening.

8. The package of claim 2, further comprising:

a package substrate coupled to the second side of the multi-layer substrate; and a hole through the package substrate;

wherein a longitudinal axis of the hole through the package substrate extends along a longitudinal axis of the hole through the multi-layer substrate.

9. The package of claim 8, further comprising:

an acoustic seal disposed around the second opening between the first substrate layer and the package substrate;

wherein the device comprises an acoustic device.

10. The package of claim 9, wherein the acoustic seal comprises a metal layer coupled to the reference voltage.

11. The package of claim 2, wherein the shoulder region extends around an entire perimeter of the third opening.

12. The package of claim 2, wherein the first conductive layer extends continuously around an entire perimeter of the third opening.

13. The package of claim 2, wherein the first conductive layer comprises a plurality of portions disposed around the shoulder region and each of the plurality of portions is coupled to the reference voltage.

14. The package of claim 1, wherein the device comprises an electromechanical device.

15. The package of claim 1, wherein the device comprises an environmental sensor.

16. The package of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

17. An electronic device comprising:

a device package comprising:

a multi-layer substrate;

a port hole through the multi-layer substrate and comprising a first opening on a first side of the multi-layer substrate and a second opening on a second side of the multi-layer substrate, opposite to the first side;

a device disposed on the first opening of the port hole and having a first voltage;

an integrated circuit coupled to the device; and a spark arrestor comprising a first conductive layer of the multi-layer substrate disposed inside the port hole and coupled to a reference voltage.

18. The electronic device of claim 17, wherein:

the multi-layer substrate comprises:

a first substrate layer on the second side of the multi-layer substrate; and a second substrate layer between the first substrate layer and the first side of the multi-layer substrate;

a second opening of the port hole through the first substrate layer is wider in a first direction than a third opening of the port hole through the second substrate layer;

a shoulder region of the second substrate layer is exposed through the second opening from the second side of the multi-layer substrate; and the second substrate layer comprises a first conductive layer in the shoulder region coupled to the reference voltage.

19. The electronic device of claim 18, further comprising:

a package substrate coupled to the second side of the multi-layer substrate; and a hole through the package substrate;

wherein a longitudinal axis of the hole through the package substrate extends along a longitudinal axis of the hole through the multi-layer substrate.

20. A method of forming a package comprising:

forming a multi-layer substrate;

forming a port hole through the multi-layer substrate and comprising a first opening on a first side of the multi-layer substrate and a second opening on a second side of the multi-layer substrate, opposite to the first side;

disposing a device having a first voltage on the first opening of the port hole; and forming a spark arrestor inside the port hole comprising a first conductive layer of the multi-layer substrate coupled to a reference voltage.

* * * * *